April 11, 1950 B. N. FISHER 2,503,579

TELEVISION TUNING DEVICE

Filed Oct. 9, 1948 3 Sheets-Sheet 1

INVENTOR.
BERNE N. FISHER
BY
James and Franklin
ATTORNEYS.

April 11, 1950 B. N. FISHER 2,503,579

TELEVISION TUNING DEVICE

Filed Oct. 9, 1948 3 Sheets-Sheet 2

INVENTOR.
BERNE N. FISHER
BY Jameson & Franklin
ATTORNEYS.

April 11, 1950 B. N. FISHER 2,503,579

TELEVISION TUNING DEVICE

Filed Oct. 9, 1948 3 Sheets-Sheet 3

INVENTOR.
BERNE N. FISHER
BY

ATTORNEYS.

Patented Apr. 11, 1950

2,503,579

UNITED STATES PATENT OFFICE 2,503,579

TELEVISION TUNING DEVICE

Berne N. Fisher, Roselle, N. J., assignor to General Instrument Corporation, Elizabeth, N. J., a corporation of New Jersey Application October 9, 1948, Serial No. 53,639

16 Claims. (Cl. 250—40)

The present invention relates to a television tuning device and in particular to one employing a rotary variable condenser for tuning purposes and capable of being tuned over the entire commercial television band through manipulation of a single control element.

Commercial television is broadcast over a plurality of channels the transmitting frequencies of which are fixed. Because of the high frequencies involved, and because of the precision in tuning necessary if reception of adequate quality is to be achieved, the design and construction of television tuning devices has presented many difficulties to the designer. For the conventional radio broadcast band, the now familiar rotary variable condenser has given quite satisfactory service, being accurately tunable and being manufactured on a large scale at low cost. However, because of the difficulties inherent in the detection and amplification of the frequencies in the television band, and because of the requirements of low cost and positive action which are such prime factors in the manufacture of receiving sets capable of being mass produced and sold to the public for home use, it has heretofore been considered impractical to employ standard rotary variable condensers in television tuning devices.

In addition, the television broadcasting channel is so wide when the problems of tuning at the high frequencies involved are considered that much difficulty has been experienced in providing suitable television tuning devices tunable over the entire television band by means of a single control. It has been found necessary, in general, to employ a relatively large number of individual tuning units, often preset but sometimes tunable over a limited range, and to provide a switch for connecting one and then another of these tuning devices into the television receiving circuit in accordance with the television channel to be received. Because of the delicacy of tuning required, these switches represent a source of considerable trouble insofar as accurate and fool-proof reception is concerned, and are themselves significantly expensive.

The standard television tuning devices of the type commercially available today give the operator the opportunity of selecting the television channel reception of which is desired. Once this channel has been selected, the operator has but little opportunity to obtain precise tuning, and then only by a control quite definitely separate in function, location and operation from the channel selector. Precise tuning is necessary because, although the frequency of transmission does not vary, the circuit components in the receiving set, because of age, changing climatic conditions, or other causes, vary slightly in their characteristics and while at one time they may give accurate tuning, at another time they may not.

It is the prime object of the present invention to devise a television tuning device which utilizes rotary variable condensers for tuning purposes.

It is another prime object of the present invention to devise a television tuning device which is operable over the entire television band through the manipulation of but a single knob or handle, thus making the unit very convenient to operate.

A further object of the present invention is to devise such a tuning device having positive television channel selection and precise tuning within each channel, thus enabling the user to obtain best results at all times no matter what the instantaneous condition of the circuit elements may be. A collateral object is to spatially and functionally correlate the channel selection and precise tuning controls, thereby simplifying operation of the device.

A further object is to devise a television tuning device utilizing a plurality of inductance-condenser tuning sets, each tunable over a portion of the entire television band, with automatic switching to provide continuous tuning over the entire band.

Yet another object is to provide a television tuning device utilizing a plurality of rotary variable condenser tuning sets so designed that when one set reaches its maximum capacity another set is automatically connected into the receiving circuit, picks up from the maximum capacity of the previous set, and goes still higher in capacity. A subsidiary object is to provide such a tuning device in which the condenser tuning sets are so placed that the condensers not connected in the circuit act as shields for the condensers connected in the circuit, thus increasing fidelity of reception at the high frequencies employed.

A still further object of the present invention is to devise a television tuning device which is extremely compact and which employs extremely short leads between the various circuit elements, thus increasing efficiency and accuracy of reception at high frequencies.

Still another object is to devise a television tuning device in which the number of switching actions is minimized, and in particular in which only one switching action is necessary in order to tune over the entire television band, thus reducing the possibility of trouble inherent in the switching operation.

A more specific object of the present invention is to devise a television tuning device which is positive in operation, extremely accurate, relatively simple in construction, and capable of fabrication in quantity so as to be relatively inexpensive when compared with prior art television tuning devices of comparable quality.

To the accomplishment of the foregoing objects and such other objects as may hereinafter appear, the present invention relates to the construction of a television tuning device as defined in the appended claims and as described in this specification, taken together with the accompanying drawings, in which:

Figures 1, 2:
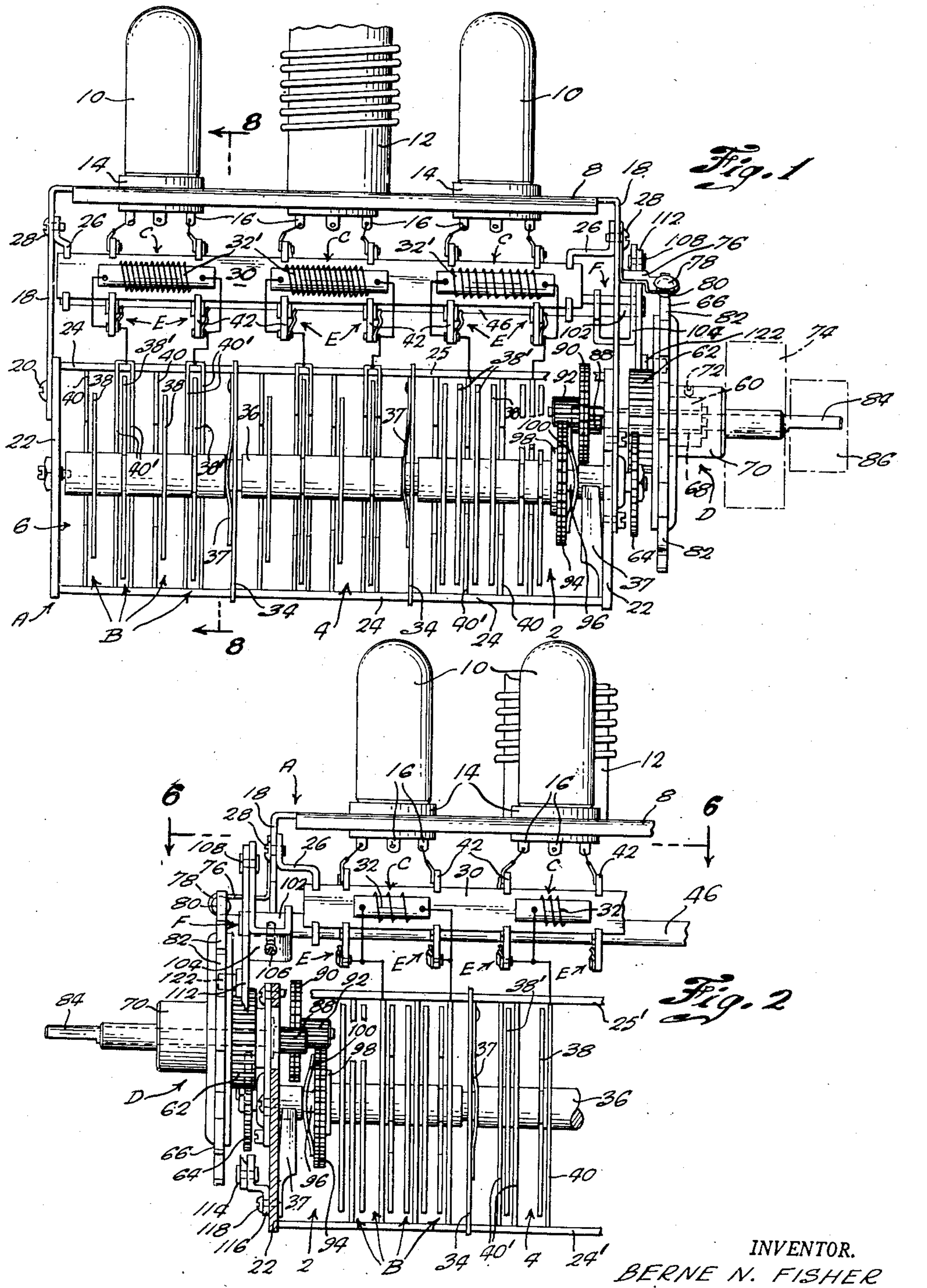
Fig. 1 is a side view of one embodiment of the present invention.
Fig. 2 is a fragmentary view from the other side thereof.
Figure 3:
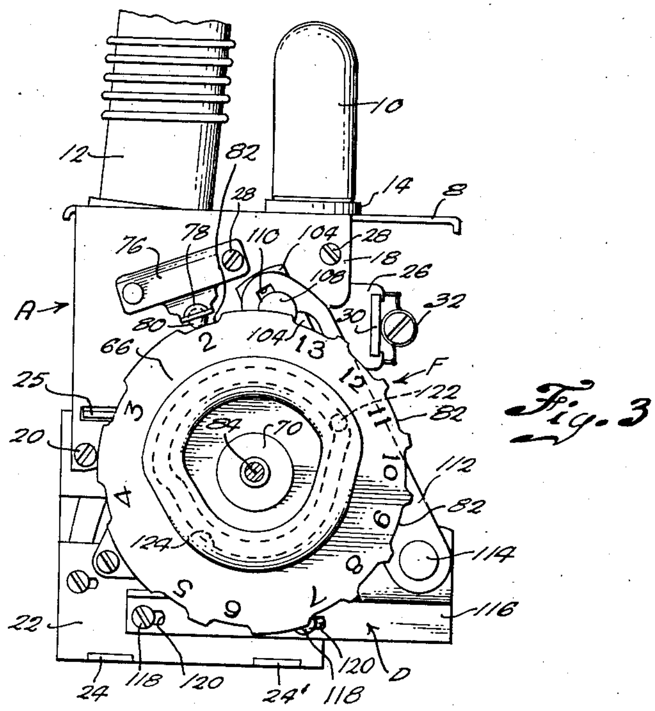
Fig. 3 is an end view of the right hand end of Fig. 1.
Figure 5:
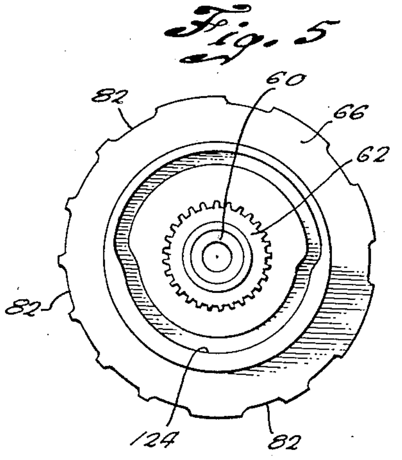
Fig. 5 is an elevation view of the inner surface of the control disc.
Figure 4:
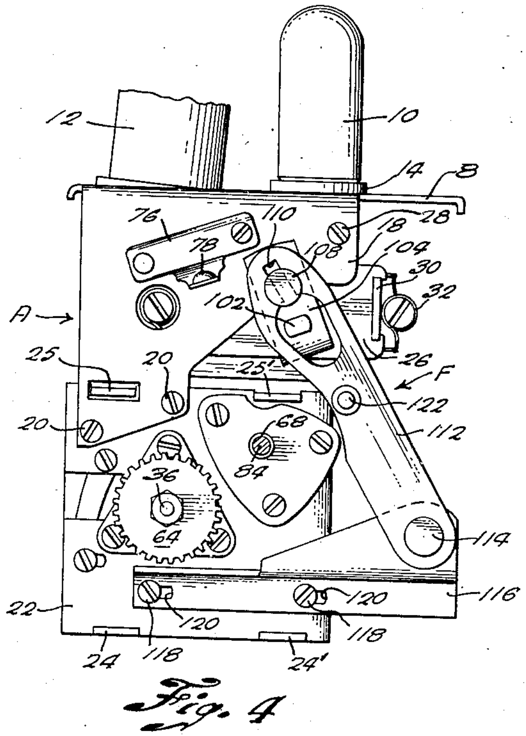
Fig. 4 is an end view similar to Fig. 3 but with some parts removed.
Figure 6:
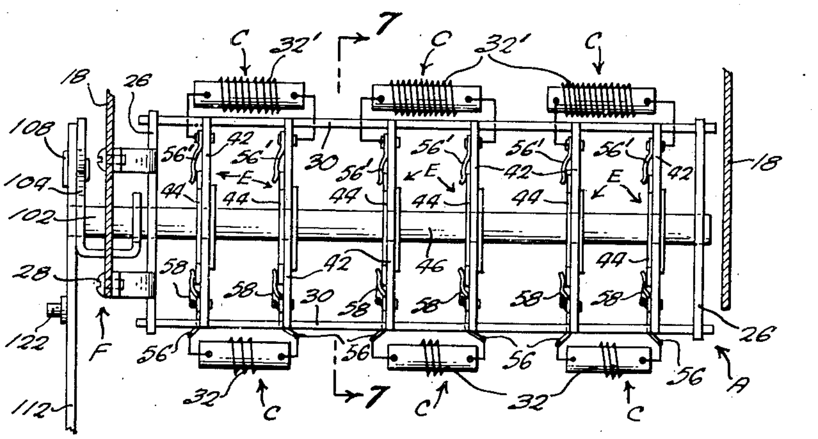
Fig. 6 is a top view taken along the line 6—6 of Fig. 2.

Considered broadly, the tuning device of the present invention comprises a frame generally designated A in which a plurality of rotary variable condensers generally designated B and a plurality of inductances generally designated C are mounted, the inductances and condensers being electrically connected so as to define a plurality of inductance-condenser tuning sets. Means generally designated D are provided for tuning the inductance-condenser tuning sets. Switches E are electrically interconnected to the inductance-condenser tuning sets and are manipulatable so as to connect one or another of those tuning sets into the television receiving circuit. A linkage F is operatively connected to the tuning means D and the switch E so that the latter is automatically manipulated in accordance with the position of the former. The inductance-condenser tuning sets are so constructed as to be tunable over a portion, and preferably half, of the television band, one set being tunable over a lower portion thereof and another set being tunable over the next higher portion thereof, the switch E, in conjunction with the linkage F and the tuning means D, automatically connecting the appropriate set into the television receiving circuit so as to achieve tuning over the entire television band through manipulation of but a single tuning means D.

As here shown, the tuning unit is in the form of three sections 2, 4 and 6, each for tuning a different element of the television receiving circuit as, for example, the antenna, the oscillator and the detector stages. Insofar as the present invention is concerned, each of these sections 2, 4 and 6 may be identical except for the values of inductance, capacitance and resistance involved, and a description of one section will suffice for all, the detailed variation between the sections being well within the knowledge of those skilled in the art.

The frame A comprises a top metal plate 8 on which appropriate tubes 10 and traps 12 may be mounted, the tubes being receivable in conventional sockets 14 having connecting prongs 16 to which appropriate electrical connections may be made to the tube elements. The top plate 8 is provided with depending ends 18 which may be secured by means of screws 20 to bottom end plates 22 which have longitudinal bottom bars 24 and 24′ and longitudinal intermediate bars 25 and 25′ extending between them. The bars 24′ and 25′ are of non-conductive material. Brackets 26 secured to the depending ends 18 of the top plate 8 by means of screws 28 support a pair of longitudinal bars 30 of insulating material, one on each side of the device, to which a plurality of coils 32 and 32′ are secured in any appropriate manner, the inductance values of these coils being predetermined in accordance with circuit requirements. It will be noted that all of the coils 32′ mounted on one side of the device contain more turns, and hence have a higher inductance value, than the corresponding coils 32 positioned opposite them on the other side of the device.

The rotary variable condensers B are mounted in the device between the end plates 22, and below the inductances 32. Between each of the sections 2, 4 and 6 shield plates 34 of conventional construction are mounted, and a driven rotor shaft 36 is rotatably journalled between the end plates 22 in conventional manner. This shaft 36 is rotatable through at least 360° and is preferably continuously rotatable in a given direction. Sets of rotor plates 38 and 38′ are fixed to the shaft 36 and are so positioned as to come into interleaving relationship with the stator plates 40 and 40′ fixedly mounted in the device on the longitudinal bars 24′ and 25′. Conventional wipers 37 serve to electrically connect the driven rotor shaft 36 and the rotor plates 38 and 38′ thereon to the frame A, which may constitute a ground. As a result the stator plates 40 and 40′ are connected at all times to the extremities of the coils 32 and 32′ respectively, the rotor plates 38 and 38′ being connected to ground.

The term "interleaving relationship" has reference not only to the case where one rotor plate 38′ fits between but does not touch two spaced stator plates 40, as in section 6, and to the case where two rotor plates 38′ move so that a single stator plate 40′ is received between them, as in section 2, but also to the case where a single rotor plate 38 and a single stator plate 40 are movable into side by side position.

Both the rotor and stator plates 38 and 40 are preferably of the standard type covering approximately 180° and having whatever shape is dictated by tuning and tracking requirements. The stator plates 40 and 40′ are all located in line with one another. This may be best seen from Fig. 8 where it is apparent that the visible stator plate 40′, together with the other stator plates therebehind, all occupy the right hand portion of the lower part of the tuning unit. The rotor plates 38 and 38′, however, are not positioned in line but are instead displaced one from the other about the axis of the shaft 36. When, as here, two sets of variable condensers are defined in each section 2, 4 or 6, the rotor plates are displaced 180° around the shaft 36 from the rotor plates 38′.

It will be understood that when a given rotor plate 38 or 38′ starts to interleave with its stator plate 40 or 40', the capacitance between those two plates will increase until such time as the two plates are fully interleaved. Any further motion of the rotor plate 38 in the same direction will then cause the capacitance to decrease. Having reference to Fig. 8, it will be apparent that in the position shown, the condenser defined by the rotor plate 38' and the visible stator plate 40' will have its maximum capacitance value and the condenser defined by the rotor plate 38 and its invisible stator plate 40 will have its minimum capacitance value. Any further rotation of the shaft 36 will cause the condenser defined by the rotor and stator plates 38' and 40' to decrease in capacitance value while at the same time the condenser defined by the rotor plate 38 and stator plate 40 will commence to increase in capacitance value. It will also be apparent that the condenser defined by the rotor plate 38' and the two stator plates 40' will have a higher capacitance than the condenser defined by the rotor plate 38 and the single stator plate 40. Hence, even if a single condenser cannot be designed which will give adequate tuning over the entire television range, as is the case from a practical point of view, there is here provided a pair of condensers, one of which, including the single stator plate 40, has a range of capacitance suitable for tuning over half of the television band and another condenser, including the two stator plates 40', has a capacitance suitable for tuning over the other half of the television band.

It has been found preferable, although not absolutely necessary, to utilize a pair of low capacitance condensers, and a pair of high capacitance condensers in each section 2, 4 and 6, the condensers of each pair alternating in longitudinal position within the tuning unit. As a result, the stator plates 40 or 40' of whichever condenser is not connected into the receiving circuit will be interposed between the stator plates 40 or 40' of the other set of condensers, thus acting as an electrostatic shield between them and improving the fidelity and reception. It will be understood that the condensers in section 2 having the two rotor plates 38' constitute the high capacitance condensers similar to those in sections 4 and 6 having the two stator plates 40', and the condensers in section 2 having the single rotor plates 38 constitute the low capacitance set similar to the condensers in sections 4 and 6 having the single stator plate 40.

For tuning purposes, each of the condenser sets is associated with a particular inductance having a value appropriate to the circuit requirements. Thus, the high capacitance set defined by the two condensers having the dual stator plates 40' or dual rotor plates 38' are electrically connected to the inductances 32' having the larger number of turns and hence having the higher inductance values, whereas the low capacitance condenser sets defined by the condensers having the single stator plate 40 or the single rotor plate 38, are electrically connected to the inductances 30 having the fewer number of turns and hence having the lower inductance values. The condensers and inductances as thus electrically interconnected define inductance-condenser tuning sets which, in the embodiment here illustrated, are each capable of tuning over different halves of the television band.

Figure 7:
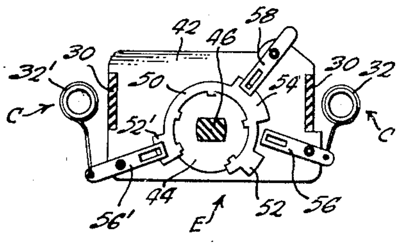
Fig. 7 is a fragmentary view of one of the rotary switches employed taken along the line 7—7 of Fig. 6.

Electrical interconnection between the inductance-condenser tuning sets and the tubes 10 and trap 12 is achieved by means of the switches E, here shown in the form of rotary switches, two for each of the sections 2, 4 and 6. A plurality of insulating plates 42, one for each switch E, are secured between the bars 30 and each is provided with a disc 44 rotatable therein, an operating shaft 46 preferably of non-circular cross-section passing through appropriately non-circular shaped apertures in the discs 44 and being rotatably mounted in brackets 26, rotation of the shaft 46 causing simultaneous rotation of the discs 44. Each disc has secured to one face thereof a conductive strip 50 extending over a portion of its circumference, the strip 50 having a pair of narrow projecting portions 52 and 52' and an elongated projecting portion 54, each being receivable between contact jaws 56, 56' and 58 respectively. The projecting portions 52, 52' and 54 are so spaced in conjunction with the location of the contact jaws 56, 56' and 58 that in one position of rotation of the shaft 46, the projecting portion 52' is received between the jaws 56' while the projecting portion 52 is not received between the jaws 56, this being the position illustrated in Figs. 7 and 8, and a position in which the projecting portion 52 is received between the jaws 56 and the projecting portion 52' is received between the jaws 56', this representing a rotation of approximately 20° in a counterclockwise direction from the position of Figs. 7 and 8. In both of these positions, the projecting portion 54 is received between the jaws 58. The jaws 58 are electrically connected to appropriate lugs 16 leading to the tubes 10 or the trap 12, the jaws 56 are electrically connected to appropriate points on one of the inductance-condenser tuning units, here specifically illustrated as the set including the lower inductances 32 and the low capacitance condensers having the single stator plate 40 or rotor plate 38, and the jaws 56' are electrically connected to another of the inductance-condenser tuning sets, here illustrated as the high capacitance tuning set including the high inductances 32' and the condensers having the twin stator plates 40' or the twin rotor plates 38', in each case so as to make connection with one set of stator plates and one extremity of its associated coil. It will be apparent that when the switch E is in its position illustrated in Figs. 7 and 8, the high capacitance condenser-inductance tuning set will be connected into the television receiving circuit while the low capacitance condenser-inductance tuning set will not be connected into the tuning circuit. In the other position of the switch E, the converse will be true. Note that the switch controls the electrical connection not just of the coils 32 and 32', but of the condensers as well.

The condenser-inductance tuning sets, and in particular the condensers thereof, are all simultaneously tuned through rotation of the shaft 36, this being accomplished through the instrumentality of a pair of control elements, the first of these serving to tune the unit over the entire television band to select the desired television channel and the second of these being used for fine adjustment to achieve precise tuning within that channel.

The first control element comprises a first driving shaft 60 to which gear 62 is secured, that gear meshing with gear 64 fast on that portion of shaft 36 which projects out through the right hand end plate 22 in Fig. 1. In the form here specifically illustrated, the shaft 60 is in the form of a hub on one side of disc 66, the gear 62 being integrally formed with disc 66 on the other side thereof. The hub 60, disc 66 and gear 62 are all receivable over a hollow tubular support 68 projecting outwardly from the right hand end plate 22. A bushing 70 is securable to the hub 60 by means of set screws 72 and a knob 74 is secured to the bushing 70. Rotation of knob 74 will therefore cause rotation of driven condenser shaft 36 and will thus cause tuning of the various condenser sets.

A detent member, in the form of a resilient bracket 76 having a cup shaped portion 78 adapted to receive ball 80 therein, is mounted on one of the depending ends 18 of the top plate 8 and the disc 66 is provided with portions, here illustrated as depressed portions in the form of elongated peripheral notches 82, one for each television channel, cooperable with the detent ball 80 to fix the position of the television condenser rotor shaft 36 and hence to control the tuning of the condensers in accordance with the frequency of the television channel reception of which is desired. Since there are at present twelve television channels, the disc 66 is provided with twelve notches 82 as illustrated.

It will be noted that each of these notches is larger than the detent ball 80 so that some slight degree of motion of the disc 66 is permitted within its detent-determining positions, this freedom of motion permitting rotation of the rotary condenser shaft 36 within limits and thus permitting precise tuning within a given range. This precise tuning is accomplished by means of the second control element which comprises a second driving shaft 84 passable through the sleeve 68, the bushing 70 and the knob 74 and having a knob 86 secured to the outwardly projecting end thereof. The inwardly projecting end of the shaft 84, which passes through the right hand end plate 22, is provided with a pinion 88 meshing with gear 90, the latter rotating pinion 92 which in turn meshes with and rotates gear 94. The gear 94 is rotatably mounted on a reduced portion 96 of the condenser rotor shaft 36 and is retained in frictional engagement with a collar 98 fast on the shaft 36 by means of spring 100. Hence, once a given television channel has been selected by rotation of knob 74 until the detent ball 80 falls into the appropriate notch 82, precise tuning of that channel may be accomplished by rotating knob 86 which, through the gearing just described, and through the frictional connection between the gear 94 and the collar 98, will rotate the condenser shaft 36 until the detent ball 80 reaches one side edge or the other of peripheral notch 82. Once this occurs, any further rotation of the knob 86 will merely result in slipping of the gear 96 on the collar 98, so that it is imppossible to tune out of a channel if the initial precise tuning movement is initiated in the wrong direction. It is apparent from the gear train 88, 90, 92, 94 that precise fine adjustment of the condensers is achieved.

In order that the knob 86 should not spin rapidly when the knob 74 is turned, a friction drag is made active on the shaft 84, this being accomplished by making the bearing between the shaft 84 and the sleeve 68 a stiff one. The amount of the frictional drag is so chosen that it exceeds in magnitude the frictional interconnection between the gear 94 and the collar 98. Hence, when the knob 74 is rotated, thus causing the condenser rotor shaft 36 to rotate, the gear 94 will slip on the collar 98, and rotation will not be transmitted back to the knob 86.

Figure 8:
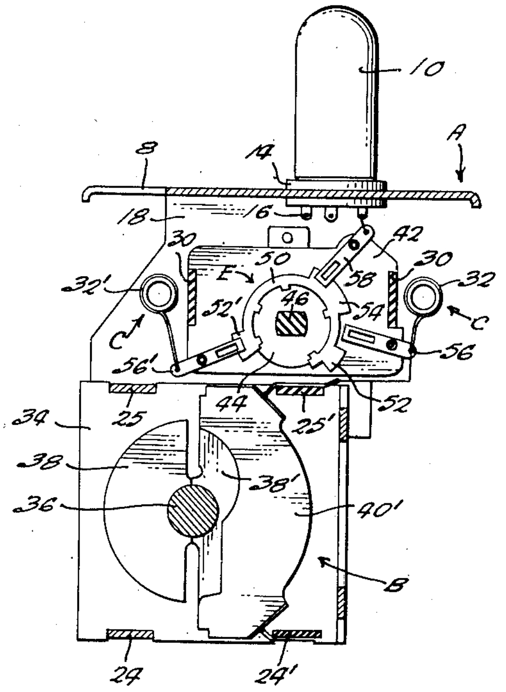
Fig. 8 is an end view taken along the line 8—8 of Fig. 1.

Since each of the inductance-condenser sets is tunable only over a portion of the television band, and since it is most desirable that a single manual control be useable over the entire band, the linkage generally designated F is provided for automatically switching one inductance-condenser set out of the circuit and another into the circuit at appropriate times. In the embodiment here illustrated, this switching is designed to take place when one condenser set has reached its maximum capacitance and is about to decrease and the other condenser set has reached its minimum capacitance and is about to increase. This occurs when, as illustrated in Fig. 8, the rotor plate 38' is fully interleaved with its stator plates 40' and the rotor plate 38 is completely out of interleaving relationship with its stator plate 40. The converse would also be true. To accomplish this switching, the projecting end 102 of the rotary switch operating shaft 46 is made fast to U-shaped link 104 both by set screw 106 and by the fact that the shaft 46 is of non-circular cross-section and fixed within a matingly shaped aperture in the link 104. The link is provided with a pin 108 which fits through slot 110 in arm 112 pivotally mounted at 114 on bracket 116 adjustably secured to the end plate 22 by means of screws 118 and slots 120. The arm 112 is provided with a cam follower in the form of a projecting pin 122 which is cooperable with a cam here shown in the form of a cam groove 124 formed on the inner side of the disc 66. The groove 124 is so shaped in conjunction with the position of the disc 66 and the corresponding position of the condenser rotor shaft 36 as to pivot the arm 112 and thus cause the operating shaft 46 of the switches E to rotate at the appropriate times above set forth.

The manner of operation and the advantages of this structure will in the main be apparent from the above description. A tuning device employing rotary variable condensers, and one which is capable of tuning over the entire broadcast band through the manipulation of a single knob 74, has been disclosed. In order to accomplish this result, a plurality of inductance-condenser tuning sets have been incorporated into the device and a switch E, automatically operated through manipulation of the same knob 74, connects the proper tuning set into the appropriate circuits at the appropriate times. Tuning is achieved, as here disclosed, by mounting the stator plates in line and by displacing the rotor plates of the different tuning sets angularly around the axis of the condenser rotor shaft 36. It is, of course, possible to mount the rotor plates in line and displace the stator plates around the shaft, but the disclosed arrangement is preferred because of simplicity in mounting and electrically interconnecting the various elements, and because the stator plates act as shields for one another. A second control, manually manipulatable by means of knob 86, is provided for vernier adjustment of the tuning sets so as to achieve precise control of tuning within a given television channel. This second control operates functionally in the same way as does the first control, to wit, both rotate the condenser shaft 36, and is spatially located close to, and preferably coaxial with the first control, thus materially facilitating manipulation of both controls. The entire construction is quite compact, having a length of approximately five and one-half inches and a height of approximately three and one-half inches, so as to be useable in even the smallest of commercial television receivers and so as to permit the production of even smaller receivers, is light in weight, and is formed of elements both of inductance, resistance and variable capacitance of a type either already available on the market or manufacturable without marked deviation therefrom, so that the tuning device may be produced at comparatively low cost. Despite the compactness and inexpensiveness of the device, it will give tuning of a high quality and precision comparable to the best on the market today. Because of the compactness, leads of small length are employed, thus making for greater efficiency, yet despite the compactness these leads are well spaced one from the other, thus minimizing the danger of interference between circuits. As a further factor in this regard, it should be noted that, by reason of the alternate spacing of the condensers in each tuning set, the stator plates of the condensers not connected in the circuit are interposed between the stator plates of those condensers connected in the circuit, thus acting as electrostatic shields.

While this specification has been drawn in terms of a "television tuner," the invention is clearly applicable to any broad band tuner, such as might be used for AM, short wave and FM broadcasts. Only one embodiment of the tuning device of the present invention has been here disclosed, an embodiment in which two tuning sets, each comprising a fixed inductance and a pair of tunable condensers, are provided for each section. Many variations may be made in this design such as, for example, utilizing different numbers of inductances or condensers, utilizing different numbers of tuning sets, utilizing specifically different condensers or inductances, varying the placement of the various circuit elements on the frame, and varying the details of the switch, the linkage for actuating the switch, and the gear trains for rotating the condenser rotor shaft. The above possible departures from the disclosure are mentioned by way of example only and many other variations are also possible all within the spirit of the invention as defined by the following claims.

I claim:

1. A tuning device comprising a frame, four sets of condenser stator plates mounted in line thereon, a shaft mounted in said frame so as to be rotatable through at least 360°, four sets of condenser rotor plates on said shaft spaced so as to interleave with said sets of stator plates respectively, each set of rotor plates being 180° displaced around said shaft with respect to an adjacent set, a selector switch, electrical connections between said switch and said stator plates and between said switch and an external circuit, said switch being active to simultaneously connect alternate sets of stator plates into said circuit, and a linkage operatively connected to said shaft and said switch for actuating the latter corresponding to the position of the former, the stator plates unconnected in the circuit thus being interposed between and shielding the stator plates connected in said circuit.

2. A tuning device comprising a frame, a plurality of inductances and a plurality of rotary variable condensers mounted thereon and connected to one another so as to define a plurality of inductance-condenser tuning sets, each having a different tuning range, a selector switch, electrical connections between said switch and said tuning sets and between said switch and an external circuit, said switch connecting one tuning set or another into said circuit, a handle connected to said condensers for simultaneously varying the capacitance of all of them, and a linkage operatively connected to said handle and to said switch for actuating the latter when one tuning set reaches the end of its tuning range so as to disconnect said set from said circuit and connect the other tuning set in said circuit, whereby tuning is provided over a plurality of ranges.

3. A tuning device comprising a frame, a plurality of inductances and a plurality of rotary variable condensers mounted thereon and connected to one another so as to define a plurality of inductance-condenser tuning sets, each of said condensers comprising a stator plate mounted on said frame and an interleaving rotor plate mounted on a shaft, said shaft being continuously rotatably mounted in said frame, the stator plates of said condensers being in line and the rotor plates of the condensers in one tuning set being 180° displaced around said shaft with respect to the rotor plates of the condensers of another tuning set, a handle connected to said shaft for rotating the same, a selector switch, electrical connections between said switch and said tuning sets and between said switch and an external circuit, said switch alternately connecting one tuning set or another into a circuit, and a linkage operatively connected to said handle and said switch for actuating the latter when one tuning set reaches the end of its tuning range so as to disconnect said set from said circuit and connect the other tuning set in said circuit, whereby tuning is provided over a plurality of ranges.

4. A television tuner comprising a frame, a rotary variable condenser mounted therein and including a driven shaft, which determines the tuning of said condenser, a detent member on said frame, a first control element connected to said shaft and having portions loosely cooperable with said detent member so as to releasably fix the position of said shaft within limits but permit some degree of freedom of motion, said shaft position corresponding to various television broadcast channels, and a second control element connected to said driven shaft for adjusting the position thereof within the freedom of motion permitted by said detent member so as to secure optimum reception within said broadcast channel.

5. The television tuner of claim 4, in which said second control element is frictionally connected to said driven shaft.

6. The television tuner of claim 5, in which a friction drag is active on said second control element, said friction drag being stronger than the frictional connection between said second control element and said driven shaft, whereby movement of said first control element does not result in movement of said second control element.

7. A television tuner comprising a frame, a rotary variable condenser mounted therein and including a driven shaft which determines the tuning of said condenser, a first driving shaft rotatably mounted in said frame and connected to said driven shaft, a control disc having depressed areas connected to said first driving shaft, a detent member on said frame cooperating with said depressed areas so as to releasably fix the position of said shafts corresponding to various television broadcast channels, said depressed areas being of greater extent than said detent member in their direction of motion relative thereto so that said shafts are permitted some degree of freedom of motion in their detent-fixed positions, and a second driving shaft rotatably mounted in said frame and frictionally connected to said driven shaft for adjusting the position thereof within the freedom of motion permitted by said detent member so as to secure optimum reception within said broadcast channels.

8. The television tuner of claim 7, in which a friction drag is active on said second driving shaft, said friction drag being stronger than the frictional connection between said second driving shaft and said driven shaft, whereby movement of said first driving shaft does not result in movement of said second driving shaft.

9. The television tuner of claim 7, in which said control disc is concentric with said first driving shaft and said depressed areas are in the form of elongated peripheral notches in said control disc.

10. The television tuner of claim 7, in which said first driving shaft is hollow and said second driving shaft is coaxially mounted in said first driving shaft.

11. The television tuner of claim 10, in which a friction drag is active on said second driving shaft, said friction drag being stronger than the frictional connection between said second driving shaft and said driven shaft, whereby movement of said first driving shaft does not result in movement of said second driving shaft.

12. In the television tuner of claim 7, a switch for making appropriate circuit connections, a linkage including a cam follower operatively connected to said switch for manipulating the same, and a cam operatively connected to said first driving shaft and active on said cam follower to control the position of said switch.

13. In the television tuner of claim 7, a switch for making appropriate circuit connections, and a linkage including a cam follower operatively connected to said switch for manipulating the same, said control disc having a cam surface with which said cam follower is cooperable to control the position of said switch.

14. The television tuner of claim 7, in which the depressed areas on said control disc are in the form of elongated peripheral notches and in which said control disc has a cam groove in one side thereof, said tuner including a switch for making appropriate circuit connections and a linkage including a cam follower operatively connected to said switch for manipulating the same, said cam follower riding in said cam groove, whereby said first driving shaft controls the position of said driven shaft and also controls the position of said switch.

15. A tuning device comprising a frame, a rotary variable condenser including a plurality of tuning sets mounted thereon, a first shaft journalled in said frame connected to said condensers for varying said condensers, a rotary switch mounted on said frame and electrically connected to said tuning sets for connecting one or another in a circuit, said switch having an operating shaft journalled in said frame, a cam on said first shaft, an arm pivotally mounted on said frame and having a cam follower cooperable with said cam, and a link connected to said operating arm and to said operating shaft for rotating said operating shaft when said arm is pivoted, said first shaft thereby simultaneously acting to tune said condensers and control which of said tuning sets is connected in a circuit.

16. A tuning device comprising a frame, a plurality of rotary variable condensers mounted thereon, a plurality of inductances on said frame electrically connected to said condensers so as to define a plurality of inductance-condenser tuning sets, a first shaft connected to said condensers for varying said condensers, a rotary switch mounted on said frame and electrically connected to said tuning sets for connecting one or another in a circuit, said switch having an operating shaft journalled in said frame, a cam on said first shaft, an arm pivotally mounted on said frame and having a cam follower cooperable with said cam, and a link connected to said operating arm and to said operating shaft for rotating said operating shaft when said arm is pivoted, said first shaft thereby simultaneously acting to tune said condensers and control which of said tuning sets is connected in a circuit.

BERNE N. FISHER.

REFERENCES CITED

The following references are of record in the file of this patent:

UNITED STATES PATENTS

| Number | Name | Date |
|---|---|---|
| 1,631,360 | Clark | June 7, 1927 |
| 2,129,756 | Elder | Sept. 13, 1938 |
| 2,316,547 | Baum et al. | Apr. 13, 1943 |
| 2,408,896 | Turner | Oct. 8, 1946 |

FOREIGN PATENTS

| Number | Country | Date |
|---|---|---|
| 323,255 | Great Britain | Dec. 23, 1929 |